United States Patent [19]
Callan

[11] Patent Number: 4,507,571
[45] Date of Patent: Mar. 26, 1985

[54] OPTICALLY COUPLED INPUT CIRCUIT FOR DIGITAL CONTROL

[75] Inventor: John E. Callan, Milwaukee, Wis.

[73] Assignee: Allen-Bradley Company, Milwaukee, Wis.

[21] Appl. No.: 427,568

[22] Filed: Sep. 29, 1982

[51] Int. Cl.[3] .......................... H03K 5/20; H03K 5/08
[52] U.S. Cl. ................................ 307/278; 307/261; 307/311; 307/350; 307/360; 307/475; 307/257; 307/318; 307/321; 328/2; 363/126
[58] Field of Search ............... 307/278, 311, 261, 255, 307/257, 318, 360, 350, 475; 250/551; 323/284; 363/126, 89, 86; 328/2

[56] References Cited

U.S. PATENT DOCUMENTS

| | | | |
|---|---|---|---|
| 3,691,403 | 9/1972 | Newmeyer | 307/231 |
| 3,992,636 | 11/1976 | Kiffmeyer | 307/231 |
| 4,079,272 | 3/1978 | Howatt | 307/311 |
| 4,086,503 | 4/1978 | Fox | 307/363 |
| 4,275,307 | 6/1981 | Struger et al. | 250/551 |

OTHER PUBLICATIONS

Tony Bishop, Relays: Solid State I/O Converter Modules Feature Optically Isolated Inputs, May 1976, Canadian Electronics Engineering.

Allen Bradley Part No. 634,760, "AC/DC Input Module".

Primary Examiner—Stanley D. Miller
Assistant Examiner—Richard Roseen
Attorney, Agent, or Firm—Barry E. Sammons

[57] ABSTRACT

An a.c. input circuit for converting a sensed a.c. voltage into a logic level voltage includes a rectifier for converting the sensed a.c. voltage to a d.c. voltage which is supplied through a coupling impedance to the light emitter of an optical isolator. While the a.c. input voltage is below a first predetermined voltage, a switchable low impedance circuit path in parallel with the light emitter is rendered conductive to maintain a low impedance across the light emitter to prevent the light emitter from becoming conductive. A switchable high impedance circuit path in parallel with the switchable low impedance circuit path becomes conductive once the sensed a.c. input voltage reaches the predetermined voltage to drive the light emitter into hard conduction. The switchable high impedance circuit path remains conductive until the sensed a.c. input voltage drops below a second predetermined value, at which point the light emitter is turned off and the switchable low impedance path becomes conductive.

3 Claims, 1 Drawing Figure

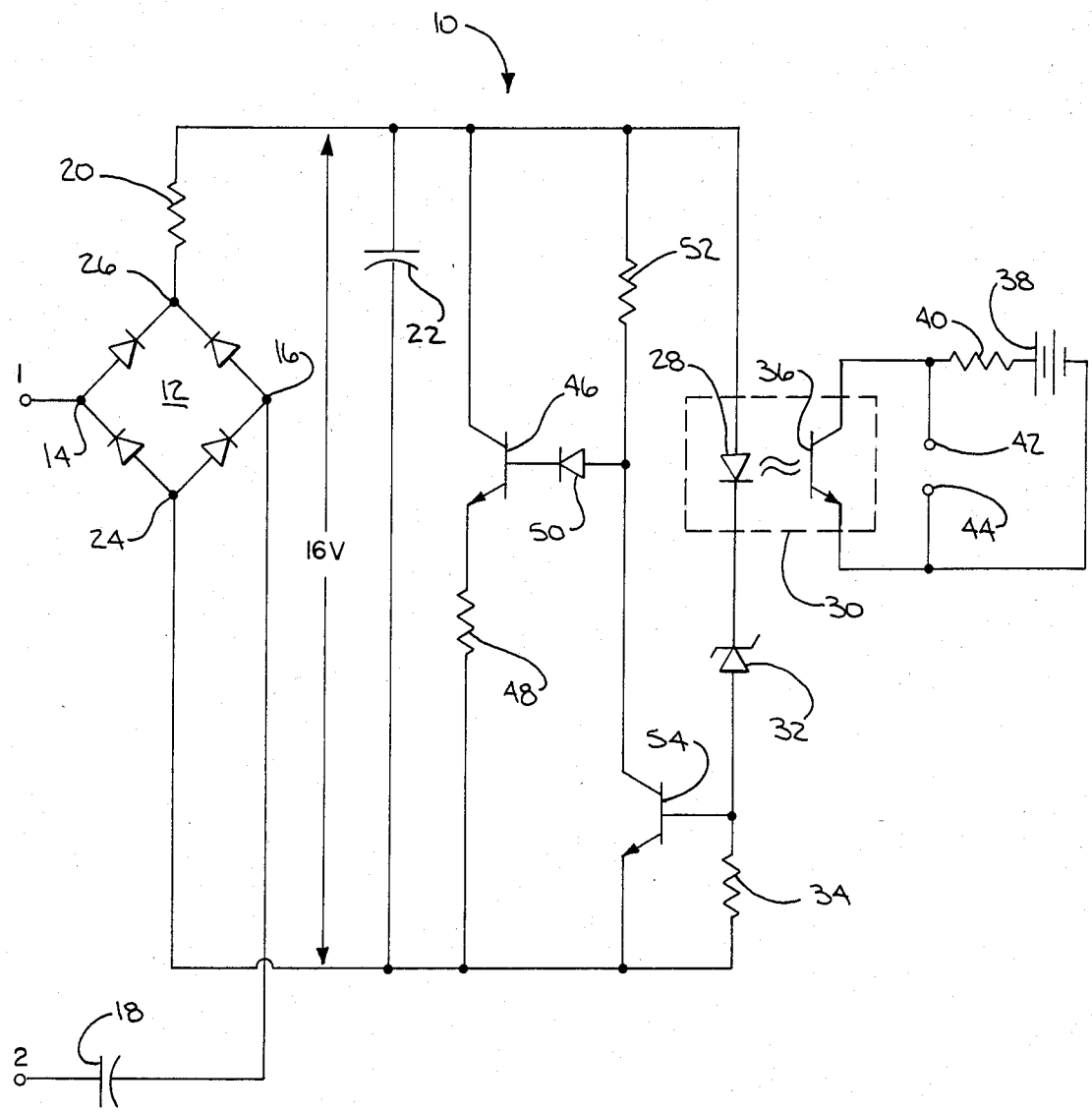

OPTICALLY COUPLED INPUT CIRCUIT FOR DIGITAL CONTROL

BACKGROUND OF THE INVENTION

The field of this invention is input circuits for digital controllers such as a programmable controller and more particularly input circuits for a digital controller for converting an a.c. input voltage to a logic level voltage.

In industrial environments, digital programmable controllers are commonly employed to control various devices, such as motors, relays, solenoids, or the like in a particular sequence in accordance with certain sensed conditions. The sensed condition may be the contact state of a switch, the resistance of a photoelectric cell or the level of an a.c. voltage. When the programmable controller is to control a motor for example in accordance with a sensed a.c. voltage, it is usually desirable to isolate the a.c. voltage from the programmable controller to avoid damaging of programmable controller components. To achieve isolation between the programmable controller and the sensed input voltage, an input module or circuit is employed to convert the sensed a.c. voltage into a logic level signal, which is then supplied to the input of the programmable controller which controls the motor or other device in accordance with the level of the logical voltage.

A.C. input circuits for converting a sensed a.c. voltage into a logic level voltage are known in the art. Examples of such circuits may be found in U.S. Pat. Nos. 3,691,403, 3,992,636 and 4,079,272. A typical a.c. input circuit such as described in the above identified patents includes a rectifier circuit for rectifying the sensed a.c. input voltage to provide a d.c. voltage whose magnitude varies directly with the magnitude of the sensed a.c. voltage. An optical isolator has its light emitter coupled, sometimes in series with a resistance to limit current to a predetermined value, across the rectifier output terminals so as to be energized therefrom. The photoconductive semiconductor of the optical isolator is rendered conductive by the light emitting diode when the d.c. output voltage of the rectifier becomes of sufficient magnitude to excite the light emitter. One or more Zener diodes may be coupled in series with the light emitter of the optical isolator across the rectifier output to set the voltage level at which the logic state of the opto-isolator changes.

Prior art input circuits for programmable controllers are subject to a form of "contact bounce", that is to say, the logical level of the output signal of the optical isolator tends to vacillate when the sensed a.c. input voltage across the rectifier input terminals varies slightly about the threshold voltage necessary to excite the light emitter of the optical isolator. As may be expected, this vacillation is very undesirable as it usually leads to a faulty logic level input to the programmable controller which then results in error in the control of the various output devices controlled by the programmable controller. Phrased in a different way, prior art input circuits for programmable controllers lack significant hysteresis characteristics which would prevent contact bounce due to small variations of the input voltage.

BRIEF SUMMARY OF THE INVENTION

Briefly, in accordance with the preferred embodiment of the present invention, an improved a.c. input circuit for converting an a.c. input voltage into a logic level voltage comprises a switchable high impedance circuit path and a switchable low impedance circuit path, each coupled in parallel with the light emitter of an optical isolator. A coupling impedance couples the parallel combination of the light emitter, the switchable high impedance circuit path, and the switchable low impedance circuit path across the output terminals of a rectifier whose input terminals are supplied with the sensed a.c. input voltage. While the magnitude of the sensed a.c. input voltage at the rectifier input terminals is below a first predetermined magnitude, the switchable low impedance circuit path is conductive to maintain a low impedance across the light emitter to keep the voltage thereacross below the light emitter threshold voltage, thereby keeping the light emitter nonconductive. When the sensed a.c. input voltage at the rectifier input terminals equals or exceeds the first predetermined voltage magnitude at which magnitude the d.c. output voltage of the rectifier equals or exceeds the threshold voltage of the light emitter, then the switchable high impedance circuit path is rendered conductive to maintain a high impedance across the light emitter. The high impedance across the light emitter maintained by the switchable high impedance circuit path results in a large voltage appearing across the light emitter to insure that after the light emitter is rendered conductive, the light emitter is driven into hard conduction so that the light emitter exhibits a sharp "turn-on". The switchable high impedance circuit path remains conductive to maintain a high impedance and hence high voltage across the light emitter until the input voltage to the rectifier drops to a second predetermined voltage at which voltage the switchable low impedance circuit path becomes conductive and the switchable high impedance circuit path becomes nonconductive. Once the low impedance circuit path becomes conductive, the light emitter becomes nonconductive so that in this way, the input circuit causes a sharp light emitter "turn-off". The switching action of the high impedance and low impedance circuit paths cause the input circuit to exhibit a very desirable hysteresis switching characteristic.

A general object of the invention is to provide an a.c. input circuit exhibiting significant hysteresis characteristics. This is achieved by the present invention which employs a switchable high impedance and switchable low impedance circuit paths in shunt with the capacitance of the filter coupled across the rectifier output terminals. The low impedance circuit path keeps the optical isolator from changing logic states until the a.c. input voltage exceeds a predetermined magnitude. The high impedance circuit path keeps the light emitter of the optical isolator energized once the predermined a.c. input voltage is reached until the a.c. input voltage drops well below the predetermined voltage.

Another object of the present invention is to provide an a.c. input circuit having a reduced likelihood of "contact bounce." This is achieved by the filter circuit coupled across the output terminals of the rectifier circuit and the hysteresis switching characteristic.

Other objects and advantages of the present invention will appear from the following description thereof.

BRIEF DESCRIPTION OF THE DRAWINGS

The features of the invention believed to be novel are set forth with particularity in the appended claims. The invention itself, however, both as to organization and method of operation, together with further objects and advantages thereof may best be understood by a reference to the following description taken in conjunction with the accompanying drawing in which:

The sole FIGURE is an electrical schematic diagram of the a.c. input circuit constructed in accordance with the teachings of the present invention.

DETAILED DESCRIPTION OF THE PREFERRED EMBODIMENT

Referring now to the sole FIGURE, there is shown an improved a.c. input circuit 10 for converting a sensed a.c. voltage into a logic level voltage. A.C. input circuit 10 is comprised of a rectifier circuit 12, typically a full wave rectifier bridge whose input terminals 14 and 16 are coupled across an a.c. input voltage at terminals 1 and 2 through a capacitance 18. Capacitance 18 acts as a current limiting impedance to the AC voltage applied at terminals 1 and 2. A filter, comprised of a relatively low valued resistance 20 in series with a capacitance 22, is coupled across output terminals 24 and 26 of the rectifier for filtering the direct current produced thereby. The filter circuit advantageously provides a finite debounce time so that the input circuit of the present invention exhibits a reduced likelihood of "contact bounce".

Shunting the capacitance 22 is the light emitter 28 of an optical isolator 30 in series with a drive circuit which includes a Zener diode 32 in series with a relatively high value resistance 34. When the voltage across capacitance 22 reaches the threshold or breakover voltage of Zener diode 32, the Zener diode 32 and light emitting diode 28 conduct current. The light produced by the diode 28 drives the photoconductive transistor 36 of the optical isolator 30 into its fully conductive state. The transistor 36 is connected in series with a voltage supply 38 and a resistor 40, and upon becoming conductive, the logical output voltage appearing across logic output terminals 42 and 44 will change from a high logic level to a low logic level.

Also shunting capacitance 22 is a switchable low impedance current path comprised of the series combination of the collector-to-emitter portion of a transistor 46 and a relatively low value resistance 48 (typically 100 ohms). The base of transistor 46 is coupled through a diode 50 to the junction between a resistance 52 and the collector of a transistor 54. The resistor 52 and transistor 54 connect in series across capacitance 22, and resistance 52, which is typically 5.1 K, is much larger in value than resistance 48. The circuit path provided by resistance 52 and transistor 54 when transistor 54 is conductive presents a very high impedance as compared to the low impedance of the circuit path presented by transistor 46 and resistance 48 when transistor 46 is conductive.

When an a.c. voltage appears across input terminals 14 and 16 of rectifier 12, the rectifier produces a rectified d.c. output voltage at terminals 26 and 24, a portion of which voltage appears across capacitance 22. When a low level a.c. input voltage is applied to the rectifier 12, base current flows through resistor 52 and diode 50 to turn on transistor 46. This effectively places resistance 48 in parallel with the capacitance 22. Resistances 48 and 20 thus effectively form a voltage divider network across output terminals 24 and 26 of the rectifier bridge, and since the ohmic value of resistance 48 is less than the ohmic value of resistance 20, a far greater percentage of the d.c. rectifier output voltage appears across resistance 20 than resistance 48. In this way, the voltage across capacitance 22 is attentuated when low a.c. input voltages are applied and the Zener diode 32 and transistor 54 remain nonconductive.

If, however, the a.c. input voltage across terminals 14 and 16 of rectifier 12 reaches a magnitude such that the d.c. voltage appearing across capacitance 22 becomes greater than the breakover voltage of Zener diode 32, then the Zener diode becomes conductive. Current then flows through light emitter 28 and drives the phototransistor 36 into conduction. Also, when Zener diode 32 becomes conductive, the transistor 54 receives base current and becomes forward biased. The transistor 54 thus becomes conductive and diverts base current from transistor 46 causing it to turn off. As a result, the low impedance provided across capacitance 22 by resistor 48 is removed and the high impedance provided by resistor 52 is connected in its place.

Since the ohmic value of resistance 52 is much larger than the ohmic value of resistance 48, the voltage across the capacitance 22 rises when the Zener diode 32 begins to conduct and a corresponding rise occurs in the current flowing through light emitting diode 28. This provides a sharp, or distinct switch point when the a.c. input voltage reaches the requisite turn-on level.

When the a.c. input voltage falls below a predetermined magnitude, the voltage across capacitance 22 drops below the breakover voltage of the Zener diode 32. The Zener diode becomes nonconductive to turn off transistor 54 and light emitter 28. The photoconductive transistor 36 of the optical isolator 30 becomes nonconductive causing a change in the level of the logic output voltage appearing across terminals 42 and 44. In addition, transistor 46 is turned on to again connect the low impedance branch containing resistor 48 across the capacitance 22. The voltage appearing across capacitance 22 thus drops and the voltage applied to Zener diode 32 drops sharply below its threshold voltage. A sharp switch point is thus insured.

From the foregoing description of the operation of the a.c. input circuit of the present invention, it can be seen that the switching action of transistors 46 and 54 imparts a very desirable hysteresis characteristic to the input circuit. In this way, the input circuit 10 causes a logic level output signal, typically at a "zero" logical level to appear across terminals 42 and 44 of the optical isolator only after the a.c. input voltage appearing at input terminals 14 and 16 of the rectifier circuit exceeds a first predetermined magnitude. The a.c. input circuit maintains the logic level output voltage at terminals 44 and 46 at this level until the a.c. input voltage drops well below the first predetermined magnitude to a second predetermined level.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. An improved a.c. input circuit for converting a sensed a.c. input voltage into a logic level voltage comprising:
    a rectifier having a pair of input terminals for connection to the sensed a.c. voltage and a pair of output terminals across which appears a d.c. voltage which varies in magnitude with the sensed a.c. input voltage;

a light emitter comprising part of an optical isolator whose conduction state changes when the voltage across said light emitter exceeds a threshold voltage;

an impedance coupled in series with said light emitter across the output terminals of said rectifier;

a switchable low impedance circuit path coupled across the light emitter for maintaining a low impedance path thereacross while the sensed a.c. input voltage is below a first predetermined voltage magnitude to keep the voltage across said light emitter below said threshold voltage thereby keeping said light emitter from becoming energized until the sensed a.c. input voltage reaches said first predetermined voltage level so that said light emitter exhibits a sharp turn-on;

and a switchable high impedance circuit path coupled across said light emitter in parallel with said switchable low impedance circuit path for providing a high impedance circuit path thereacross once the sensed a.c. input voltage reaches said first predetermined voltage magnitude to keep the voltage across said light emitter at or above said threshold voltage so as drive said light emitter into hard conduction and said switchable high impedance circuit path maintaining a high impedance across said light emitter to keep the voltage across said light emitter at or above said threshold voltage until the sensed a.c. input voltage falls to a second predetermined voltage at which voltage said switchable high impedance circuit path becomes nonconductive and said low impedance circuit path becomes conductive to render said light emitter nonconductive so that said light emitter exhibits a sharp turnoff.

2. The invention according to claim 1 wherein said switchable high impedance circuit path comprises a high ohmic value resistance coupled in series with the collector-to-emitter portion of a transistor whose base is coupled to said light emitter.

3. An input circuit for converting an a.c. voltage into a logic level voltage comprising:

a full wave rectifier bridge having a pair of input terminals coupled to the a.c. voltage and producing a d.c. voltage at a pair of output terminals;

a filter comprised of a resistance and a capacitance serially coupled across the output terminals of said full wave rectifier for smoothing a part of the d.c. output voltage produced by said rectifier;

a light emitter comprising a part of an opto-isolator, said light emitter, when energized, rendering said opto-isolator conductive to generate a logic voltage at a first level;

a Zener diode and a second resistance coupled in series with said light emitter across said capacitance for permitting the passage of current therethrough to energize said light emitter when the voltage level across said capacitance reaches the threshold voltage of said Zener diode which will occur when the a.c. voltage appearing across the input terminals of said full wave rectifier exceeds a first predetermined magnitude;

a first transistor and a third resistance, said first transistor having its collector to emitter portion coupled in series with said third resistance across said capacitance and said transistor having its base coupled to the junction between said Zener diode and said second resistance, said first transistor becoming conductive and providing a high impedance circuit path across said capacitor upon said Zener diode becoming conductive to maintain the voltage level across said capacitance at said threshold level once the a.c. input voltage across said rectifier input terminals reaches said first predetermined magnitude and maintaining the voltage across said capacitance above said threshold voltage until said a.c. input voltage falls well below said first predetermined magnitude; and a second transistor and a fourth resistance, said second transistor having its collector-to-emitter portion coupled in series with said fourth resistance across said capacitance and said second transistor having its base coupled to the junction between said third resistance and said first transistor, said second transistor being conductive to provide a low resistance circuit path across said capacitance when said a.c. input voltage to said rectifier is less than said first predetermined magnitude and when the a.c. input voltage rises to said first predetermined magnitude said second transistor being maintained nonconductive by said first transistor until the a.c. input voltage drops well below said first predetermined magnitude at which time said second transistor resumes its conductive state.

* * * * *